United States Patent
Ono

(10) Patent No.: US 6,687,885 B2
(45) Date of Patent: Feb. 3, 2004

(54) CORRECTION OF LAYOUT PATTERN DATA DURING SEMICONDUCTOR PATTERNING PROCESS

(75) Inventor: Yusaku Ono, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 294 days.

(21) Appl. No.: 09/793,417

(22) Filed: Feb. 27, 2001

(65) Prior Publication Data

US 2002/0026624 A1 Feb. 28, 2002

(30) Foreign Application Priority Data

Aug. 30, 2000 (JP) .................................. P 2000-260518

(51) Int. Cl.[7] .............................................. G06F 17/50
(52) U.S. Cl. ................................ 716/5; 716/11; 716/19
(58) Field of Search ................................ 716/8, 19, 20, 716/11, 4, 5

(56) References Cited

U.S. PATENT DOCUMENTS

| | | | |
|---|---|---|---|
| 5,553,273 A | * | 9/1996 | Liebmann ..................... 716/21 |
| 5,553,274 A | * | 9/1996 | Liebmann ..................... 716/21 |
| 5,740,068 A | * | 4/1998 | Liebmann et al. ............ 716/21 |
| 6,470,489 B1 | * | 10/2002 | Chang et al. .................. 716/21 |
| 6,516,459 B1 | * | 2/2003 | Sahouria ....................... 716/21 |

OTHER PUBLICATIONS

Hierarchical DRC Tool Manual by Mentor Company, "Extracting a polygon layer by means of an edge layer".
Hierarchical DRC Tool Release Note by Mentor Company, "Corner Fill Keyword For Expand Edge".

* cited by examiner

Primary Examiner—Leigh M. Garbowski
Assistant Examiner—Brandon Bowers
(74) Attorney, Agent, or Firm—McDermott, Will & Emery

(57) ABSTRACT

A layout pattern data correction device includes: (a) edge extracting means for extracting a first target edge to be corrected from an original layout pattern of a circuit; (b) edge modifying region setting means for setting an edge modifying region in which the first target edge is modified with a predetermined point in the first target edge taken as a center; (c) edge modifying means for modifying the first target edge within the edge modifying region into a second target edge to be corrected; (d) corrected pattern forming means for forming a corrected pattern based on the second target edge; and (e) boolean operation means for performing a predetermined boolean operation based on both of the original layout pattern and the corrected pattern.

16 Claims, 20 Drawing Sheets

CORRECTION OF LAYOUT PATTERN DATA DURING SEMICONDUCTOR PATTERNING PROCESS

BACKGROUND OF THE INVENTION

1. Field of the Invention

The present invention relates generally to a layout pattern data correction device and, in particular but not exclusively, to the layout pattern data correction device for correcting pattern distortions caused during pattern formation by the utilization of a photo lithography technology, etching technique, or the like.

2. Description of the Related Art

Recently, a design rule of a semiconductor device has reached an accuracy level of 0.15 µm, which is smaller than the wavelength of light emitted from a light source (0.248 µm in the case of a KrF excimer laser) that is largely used in association with a stepper. Under such conditions, the resolution tends to be extremely deteriorated and, accordingly, the use has been made of a special lithography technology such as a modified illumination technology to improve the resolution. Although effective to improve the resolution, the use of the special lithography technology is ineffective to achieve a high fidelity reproduction of a pattern. In addition, the size of the pattern changes due to a difference in condensation and rarefaction of the pattern, when the pattern is fine.

As one solution to the above problems, OPC (Optical Proximity Effect Correction) is widely used in which a design layout pattern is modified so as to obtain a desired pattern. The OPC is available in three types; a model based OPC, a rule based OPC, and the combination thereof. In the model based OPC technique, a design layout pattern is modified based on a simulation test result. In the rule based OPC technique, a design layout pattern is modified based on a predetermined design rule (OPC rule) with regards paid to graphic characteristics of the design layout pattern such as width of each patterns, distance between the adjacent patterns, and distance from the corner of one pattern to other patterns. The combined OPC technique is that the model based and rule based OPC techniques are combined together.

Since a complex OPC is required as the pattern becomes fine, an output pattern data which is obtained after the OPC has been made tends to contain complicated polygonal features. Accordingly, the output pattern data contain those of figures having protrusions, recesses and steps. When the number of such figures increases, the number of vertexes included in the figures increases, resulting in increase in amount of the data.

The conventional rule based OPC technique will now be described with reference to FIGS. 5, 6, 21, 22, 23, and 24. FIG. 5 shows the layout pattern data of metal lines. Recently, DRC (Design Rule Check) tool is used in the practice of the rule based OPC technique. Hereinafter, it is assumed that the OPC is aimed at increasing the width of the layout patterns at a location where the neighboring patterns are spaced a distance equal to or greater than a certain value (K1).

At first, the edges of the layout patterns spaced a smaller distance from each other than the certain value are extracted by using a spacing check function of the DRC tool. Referring, for example, to the layout patterns 18 and 19 shown in FIG. 5 the edges 100 and 101 of the pattern 18 and the edge 102 of the pattern 20, which are at a distance smaller than K1 from the edges of their adjacent patterns, are extracted by using the DRC tool as shown in FIG. 21. Then, edges which have not been extracted because they are at a distance equal to or greater than K1 from adjacent patterns are extracted, and they are defined as the target edges to be corrected. As described above, Those target edges are shown in FIG. 6.

Next, corrected patterns are to be formed. This can be accomplished by subjecting the target edges to sizing with the use of the DRC tool. The target edges are oversized by an amount desired to be corrected, as shown by 110 in FIG. 23, in the case where the OPC is aimed at increasing the width of the layout patterns. When the edge 28 (FIG. 6) is oversized, an acute angled recess 103 tends to be formed as shown in FIG. 22. Then, a boolean operation is carried out between the resultant corrected patterns and the original patterns to which the OPC has not been subjected. In this case, the boolean operation is an OR (summing) operation between the resultant corrected patterns and the original patterns. After the boolean operation has been carried out, the corrected layout patterns in FIG. 24 are obtained. As shown in FIG. 24, fine protrusions 105, a recess 103, and a step 106 are produced.

According to the above-described conventional rule based OPC, the resultant layout pattern includes the graphic patterns such as fine protrusions, recesses, and steps, with an increased number of vertexes in the graphic pattern. As a result, there has been a problem in that data amount of the resultant layout patterns becomes large.

SUMMARY OF THE INVENTION

In view of the foregoing numerous problems, the present invention has been devised to eliminate the foregoing problems and is to provide a layout pattern data correction device, a method of correcting the layout pattern data, and a computer readable medium in which a layout pattern data correction program is recorded, all which are effective to prevent fine protrusions, recesses, and steps from producing and to reduce the data amount.

According to one aspect of the invention, a layout pattern data correction device includes: (a) edge extracting means for extracting a first target edge to be corrected from an original layout pattern of a circuit; (b) edge modifying region setting means for setting an edge modifying region in which the first target edge is modified with a predetermined point in the first target edge taken as a center; (c) edge modifying means for modifying the first target edge within the edge modifying region into a second target edge to be corrected; (d) corrected pattern forming means for forming a corrected pattern based on the second target edge; and (e) boolean operation means for performing a predetermined boolean operation based on both of the original layout pattern and the corrected pattern.

The edge modifying means may include means for lengthening or shortening the first target edge so that one end of the first target edge aligns with a vertex within the edge modifying region.

The edge modifying region may include a plurality of vertexes; and the edge modifying means may include means for choosing a longest segment in segments which are formed by connecting any two vertexes of the plurality of vertexes within the edge modifying region, and modifying the first target edge into the longest segment as the second target edge.

The corrected pattern forming means may include means for measuring an angle between the second target edge and an edge not to be corrected which continues to the second target edge, and forming the corrected pattern in accordance with the angle.

The corrected pattern forming means may include means for modifying the second target edge and forming the corrected pattern which is surrounded with the modified second target edge and the original layout pattern, when the second target edge does not fit to an edge of the original layout pattern.

According to another aspect of the invention, a method of correcting layout pattern data includes the steps of: (a) extracting a first target edge to be corrected from an original layout pattern of a circuit; (b) setting an edge modifying region in which the first target edge is modified with a predetermined point in the first target edge taken as a center; (c) modifying the first target edge within the edge modifying region into a second target edge to be corrected; (d) forming a corrected pattern based on the second target edge; and (e) performing a predetermined boolean operation based on both of the original layout pattern and the corrected pattern.

The step of modifying the first target edge (c) may include the step of lengthening or shortening the first target edge so that one end of the first target edge aligns with a vertex within the edge modifying region.

The edge modifying region may include a plurality of vertexes; and the step of modifying the first target edge (c) may include the step of choosing a longest segment in segments which are formed by connecting any two vertexes of the plurality of vertexes within the edge modifying region, and modifying the first target edge into the longest segment as the second target edge.

The step of forming the corrected pattern (d) may include the step of measuring an angle between the second target edge and an edge not to be corrected which continues to the second target edge, and forming the corrected pattern in accordance with the angle.

The step of forming the corrected pattern (d) may include the step of modifying the second target edge and forming the corrected pattern which is surrounded with the modified second target edge and the original layout pattern, when the second target edge does not fit to an edge of the original layout pattern.

According to another aspect of the invention, a method of producing a semiconductor device according to the above-mentioned method.

According to another aspect of the invention, a computer readable medium in which a layout pattern data correction program is recorded, the program includes the steps of: (a) extracting a first target edge to be corrected from an original layout pattern of a circuit; (b) setting an edge modifying region in which the first target edge is modified with a predetermined point in the first target edge taken as a center; (c) modifying the first target edge within the edge modifying region into a second target edge to be corrected; (d) forming a corrected pattern based on the second target edge; and (e) performing a predetermined boolean operation based on both of the original layout pattern and the corrected pattern.

The step of modifying the first target edge (c) may include the step of lengthening or shortening the first target edge so that one end of the first target edge aligns with a vertex within the edge modifying region.

The edge modifying region may include a plurality of vertexes; and the step of modifying the first target edge (c) may include the step of choosing a longest segment in segments which are formed by connecting any two vertexes of the plurality of vertexes within the edge modifying region, and modifying the first target edge into the longest segment as the second target edge.

The step of forming the corrected pattern (d) may include the step of measuring an angle between the second target edge and an edge not to be corrected which continues to the second target edge, and forming the corrected pattern in accordance with the angle.

The step of forming the corrected pattern (d) may include the step of modifying the second target edge and forming the corrected pattern which is surrounded with the modified second target edge and the original layout pattern, when the second target edge does not fit to an edge of the original layout pattern.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

This application is based on an application No. 2000-260518 filed Aug. 30, 2000 in Japan, the disclosure of which is incorporated herein by reference.

(Embodiment 1)

Hereinafter, the first embodiment will be described with reference to FIG. 1 through FIG. 13.

Figure 1:
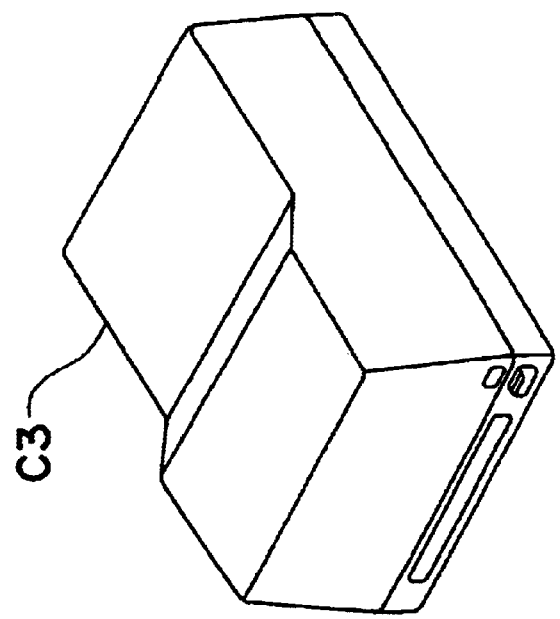
FIG. 1 is a schematic perspective view showing a computer system in which a layout pattern data correction device is utilized according to a first embodiment of the present invention.
Figure 1:
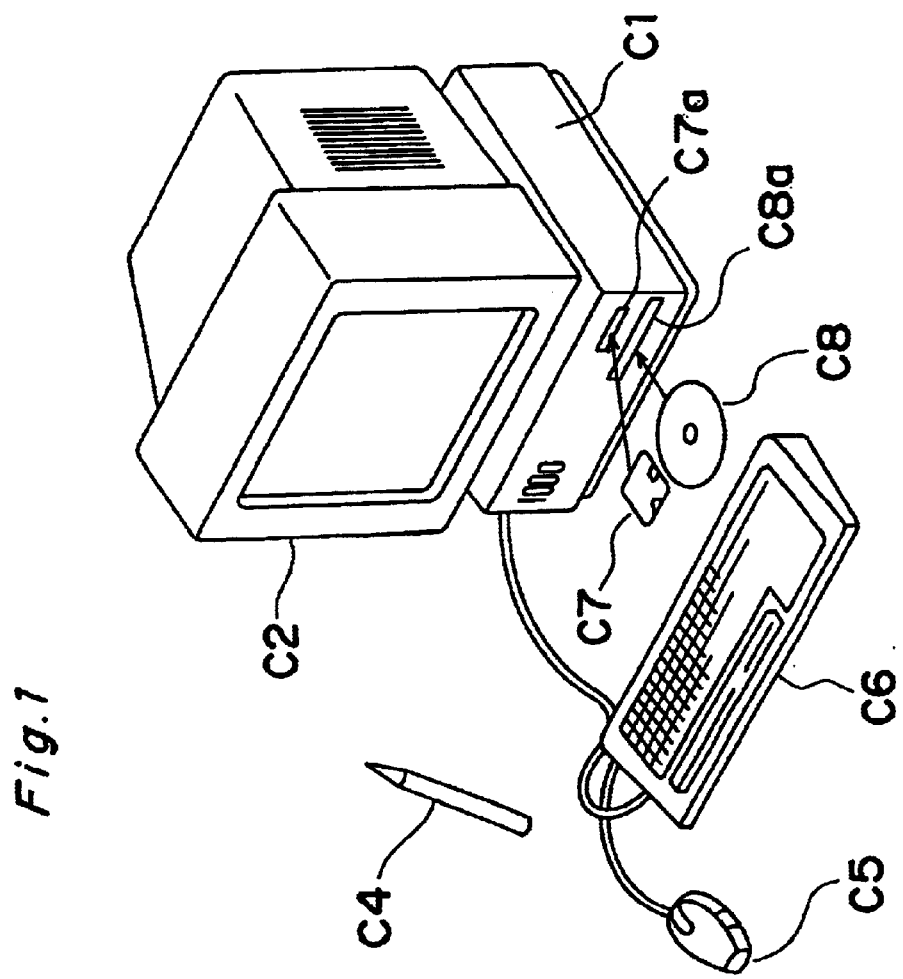
Figure 2:
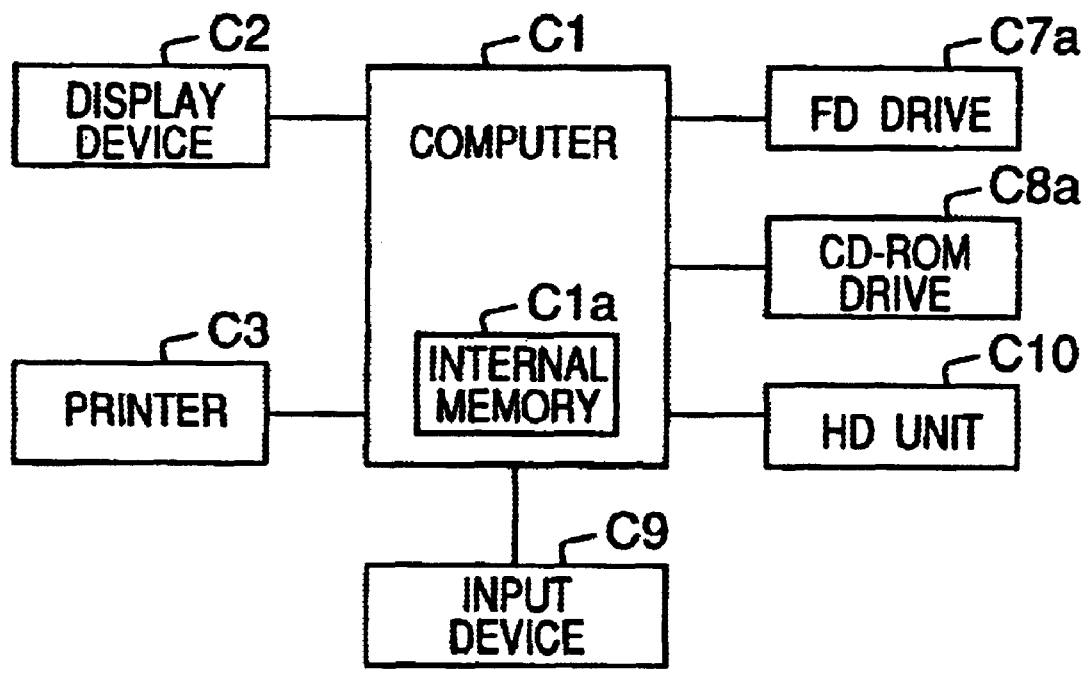
FIG. 2 is a block diagram of the computer system shown in FIG. 1.

Referring first to FIG. 1, a computer system shown therein includes a main computer C1, a display device C2, a printer C3, a pen C4, a mouse C5, a keyboard C6, an FD (floppy disk) drive C7a for receiving a floppy disk C7, and a CD-ROM drive C8a for receiving a CD-ROM C8. The floppy disk C7 and the CD-ROM C8 each have a program, data, and so on recorded therein. FIG. 2 is a block diagram of the computer system shown in FIG. 1.

In FIG. 2, the main computer body C1 has an internal memory C1a built therein, and is connected with the display device C2, the printer C3, the FD drive C7a, the CD-ROM drive C8a, an input device C9, and an hard disk (HD) unit C10. The HD unit C10 comprises a hard disk, and the input device C9 includes the pen C4, the mouse C5, the keyboard C6. Although FIG. 2 shows the main computer C1 connected with the FD drive C7a, the CD-ROM drive C8a, and the HD unit C10, FIG. 1 shows the main computer C1 having built therein the FD drive C7a, the CD-ROM drive C8a, and the HD unit C10. In the present invention, any type of the computer system can be used other than that illustrated.

Figure 3:
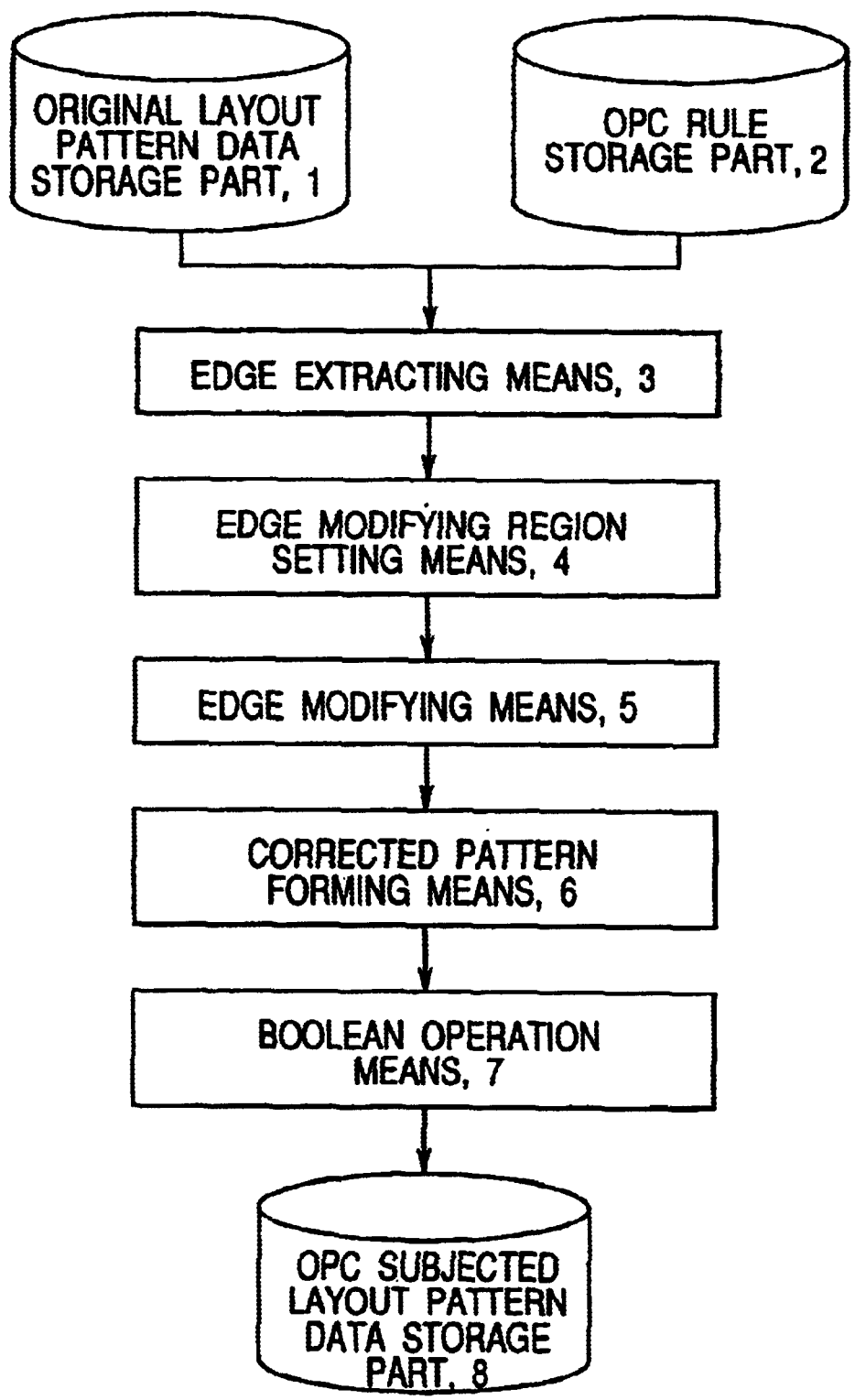
FIG. 3 is a block diagram showing the layout pattern data correction device according to the first embodiment of the present invention.

FIG. 3 is a block diagram showing the structure of the layout pattern data correction device. The layout pattern data correction device includes an original layout pattern data storage part 1 for storing original layout pattern data, an OPC rule storage part 2 for storing a file in which an OPC rule is recorded, edge extracting means 3 for extracting target edges required to be corrected, edge modifying region setting means 4 for setting a region in which the target edges to be corrected are modified, edge modifying means 5 for modifying the target edges, corrected pattern forming means 6 for forming corrected patterns based on the target edges, boolean operation means 7 for performing a boolean operation between the resultant corrected patterns and the original layout patterns, and an OPC subjected layout pattern data storage part 8 for recording the resultant layout pattern data which has been subjected to an OPC.

The original layout pattern data storage part 1, the OPC rule storage part 2, and the corrected layout pattern data storage part 8 are implemented by data. The edge extracting means 3, the edge modifying region setting means 4, the edge modifying means 5, the corrected pattern forming means 6, and the boolean operation means 7 are each implemented by a program. These data and programs may be stored in the hard disk in the HD unit C10, or a recording medium such as FD C7 and CD-ROM C8. The recording medium is not limited to the above described FD and CD-ROM, but may be a hard disk, a magnetic tape, a memory chip, or an IC (integrated circuit) card, if a computer can read it.

Figure 4:
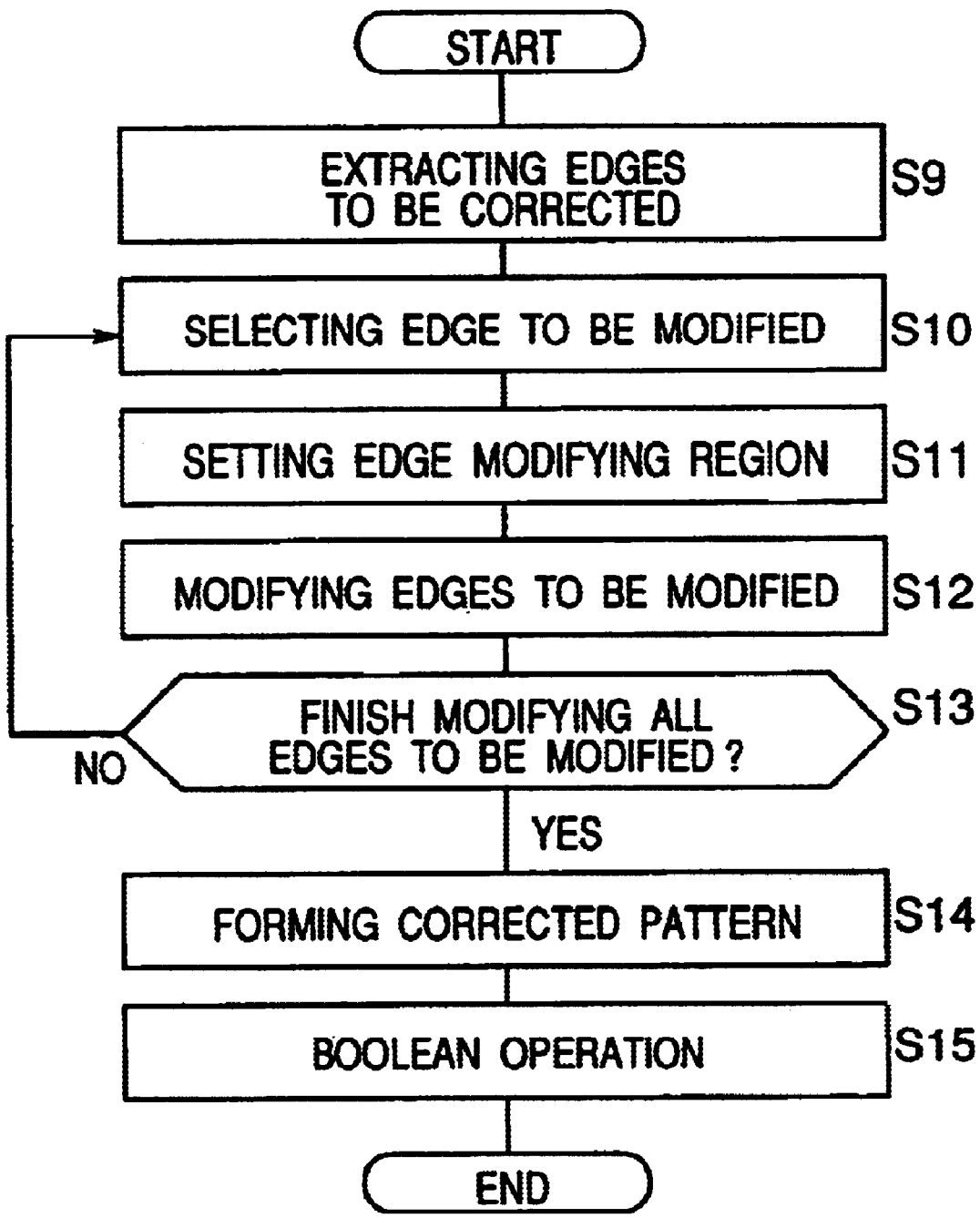
FIG. 4 is a flowchart showing the sequence of correction of the layout pattern data according to the first embodiment of the present invention.
Figure 5:
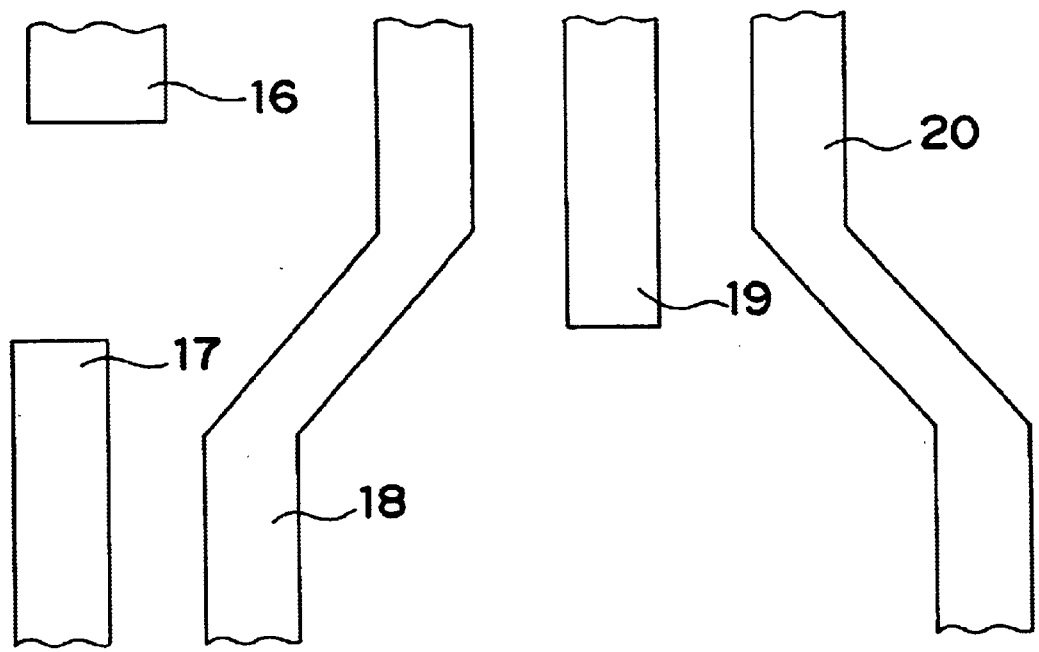
FIG. 5 shows an original layout pattern of the metal lines according to the first embodiment of the present invention.

Hereinafter, a method of correcting the layout pattern data will be described in detail with reference to FIG. 4 through FIG. 13. FIG. 4 is a flowchart showing the sequence of correction of the layout pattern data performed by the above-mentioned layout pattern data correction device. FIG. 5 shows original layout pattern of the metal lines displayed on the display device C2 for example. In this embodiment, it is assumed that an OPC in which the respective widths of the layout patterns spaced a distance equal to or greater than a constant value (K1) from adjacent layout patterns are increased, in a manner similar to that described in connection with the related art.

At first, the edges which are required to be corrected (first target edge) are extracted (FIG. 6) in a manner similar to that described in connection with the related art (Step S9 in FIG. 4). It is noted that the first target edges are shown as a thicker segment in FIG. 6.

Figure 6:
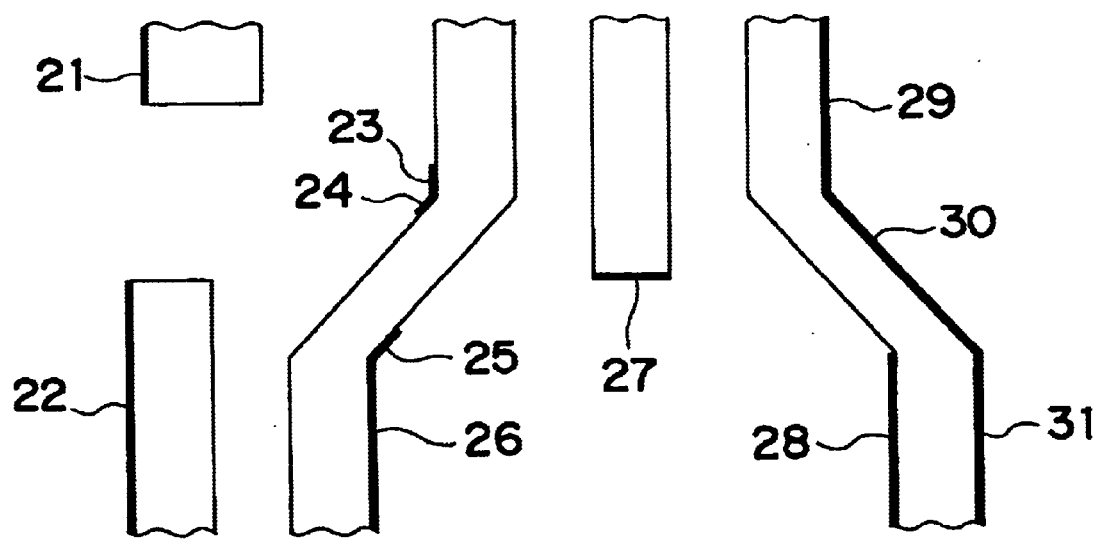
FIG. 6 shows a layout pattern of the metal lines in which target edges to be corrected have been extracted according to the first embodiment of the present invention.
Figure 7A:
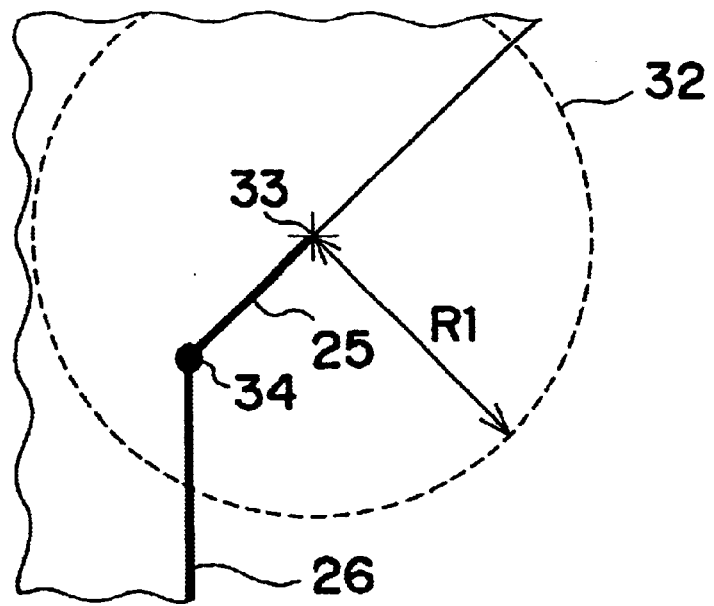
FIGS. 7A and 7B are enlarged views showing the target edges and their circumferences, respectively, for explaining a method of modifying the target edge according to the first embodiment of the present invention.
Figure 7B:
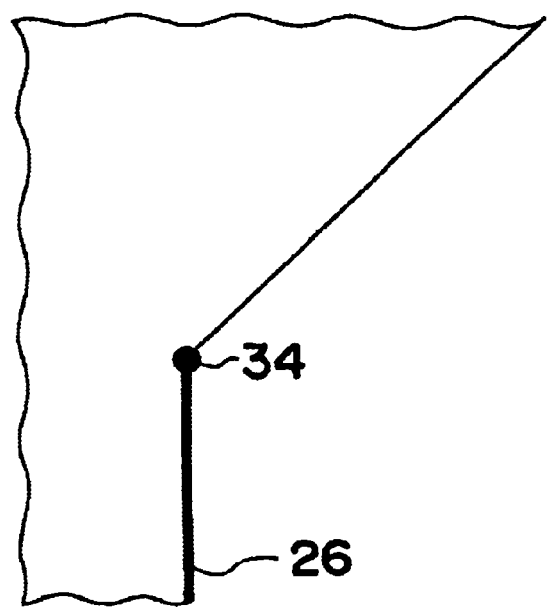

Then, an edge 25 in FIG. 6, for example, is chosen as an edge to be modified (Step S10). An enlarged view of the edge 25 and its circumference are shown in FIGS. 7A and 7B, respectively. As shown in FIG. 7A, the edge modifying region, that is, a region in which the target edges are modified, is set to a circle 32 having a radius R1 with an open end 33 taken as a center (Step S11). It is noted that the term "open end" means an end which is not connected to other target edges.

Then, it is detected if there is a vertex within the edge modifying region or not. When the detection shows that there is a vertex 34 within the region and the vertex 34 is on the target edge as shown in FIG. 7A, the open end 33 is slid to reach the vertex 34 so that the edge 25 is shortened. Hence, the edge 25 is deleted. Similarly, the edges 23 and 24 in FIG. 6 are deleted.

Figure 8A:
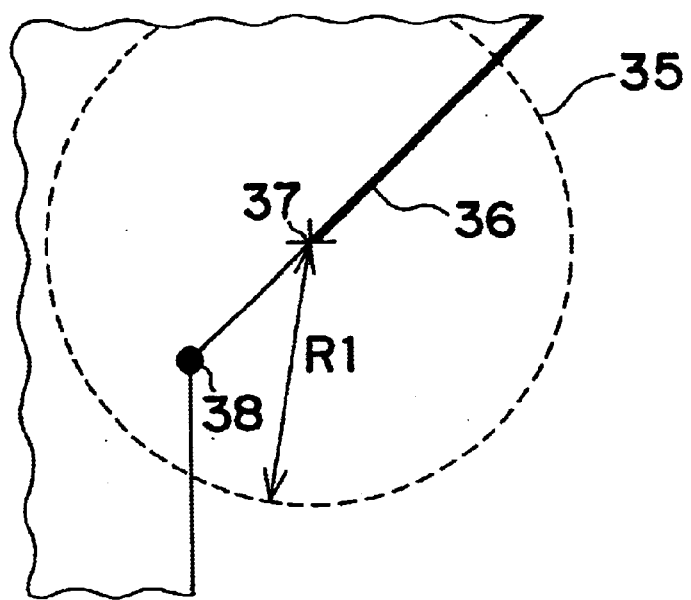
FIGS. 8A and 8B are enlarged views of the target edges and their circumferences, respectively, for explaining a method of modifying the edge to be corrected according to the first embodiment of the present invention.
Figure 8B:
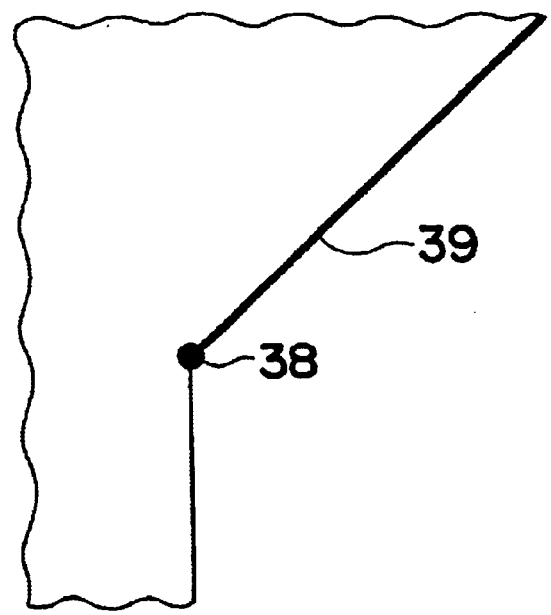

On the other hand, an example in which a target edge is lengthened will be described with reference to FIGS. 8A and 8B. As shown in FIG. 8A, the edge modifying region is set to a circle 35 having a radius R1 with an open end 37 taken as a center (Step S11), and then the detection is performed, in a manner similar to that described in connection with the edge 25 in FIG. 7A. Since the detection shows that there is a vertex 38 within the region 35 and the vertex 38 is not on the target edge, the open end 37 is slid to reach the vertex 38 so that the edge 36 is lengthened to form a new edge 39 shown in FIG. 8B.

Moreover, when the detection shows that there is no vertex in the edge modifying region such as the edges 21, 22, 26, 27, 28, 29, 30, and 31 in FIG. 6, the target edges are not modified. As described above, the first target edges, which are required to be modified, are modified (S12).

Next, it is determined whether or not all the target edges have been completely subjected to the step S10 through the step S12 (Step S13). When there is an edge which has not been subjected yet, the program flow returns to the step S10 and, on the contrary, when there is not any edge which has not been subjected yet, the program flow proceeds to a step S14.

Figure 9:
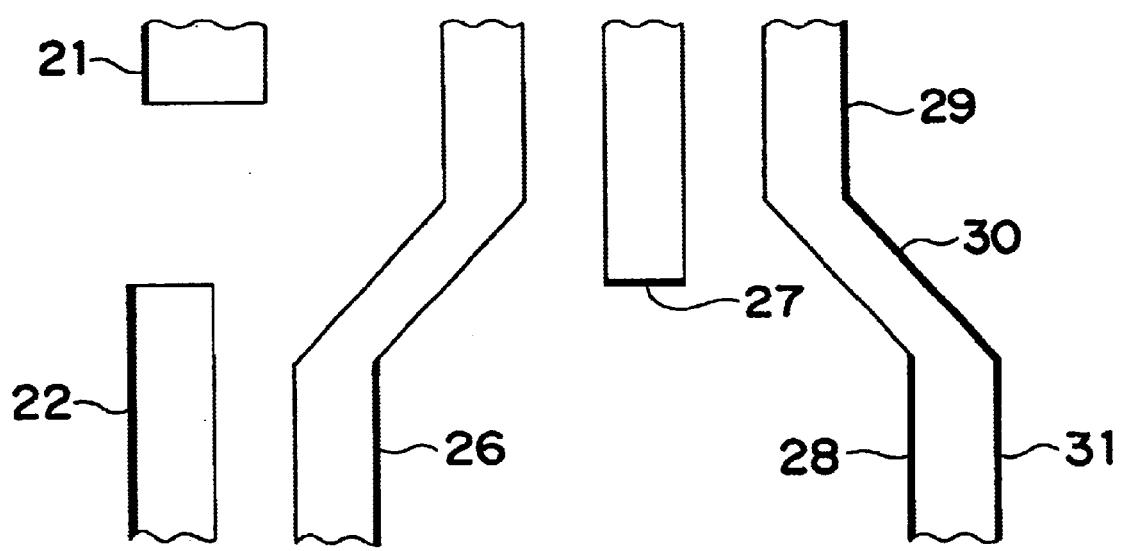
FIG. 9 shows a layout pattern of the metal lines in which the target edges have been modified according to the first embodiment of the present invention.

As described above, some first target edges which are required to be modified are modified, and the resultant layout patterns as shown in FIG. 9 are obtained. In FIG. 9, the target edges are shown as thicker segments. It is noted that the target edges such as shown in FIG. 9 are called as "second target edges" in this specification. According to the first embodiment, new target edges, that is, the second target edges, are produced by modifying some edges to be modified in the first target edges, and the following steps S14 and S15 are carried out based on the second target edges.

Figure 10A:
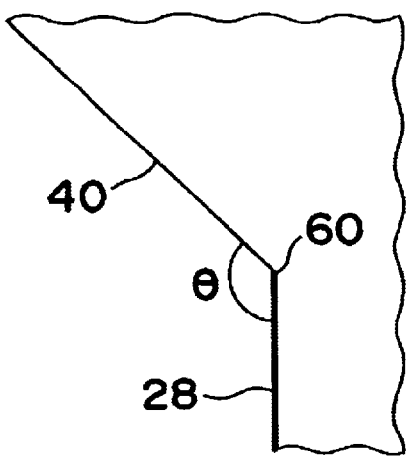
FIG. 10A through FIG. 10C are enlarged views of the target edges and their circumferences, respectively, for explaining a method of forming corrected patterns according to the first embodiment of the present invention.
Figure 10B:
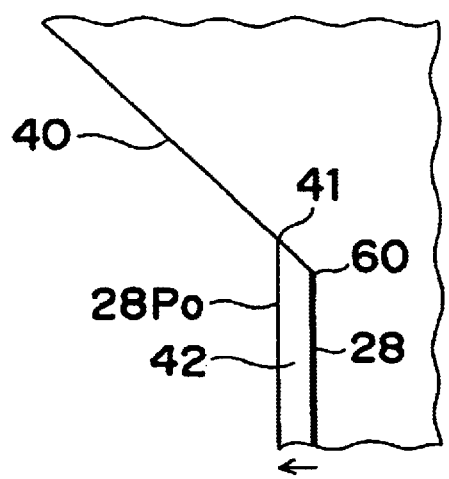
Figure 10C:
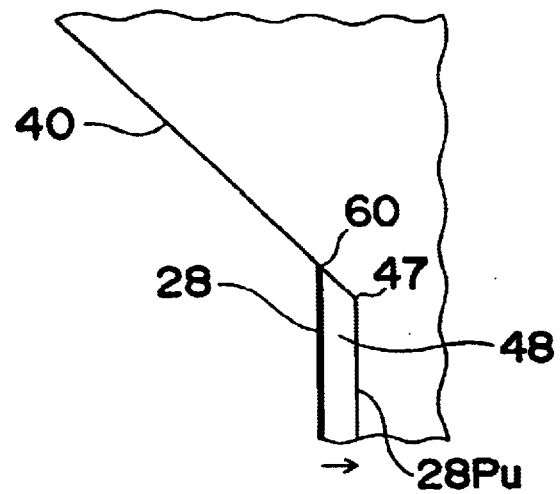
Figure 22:
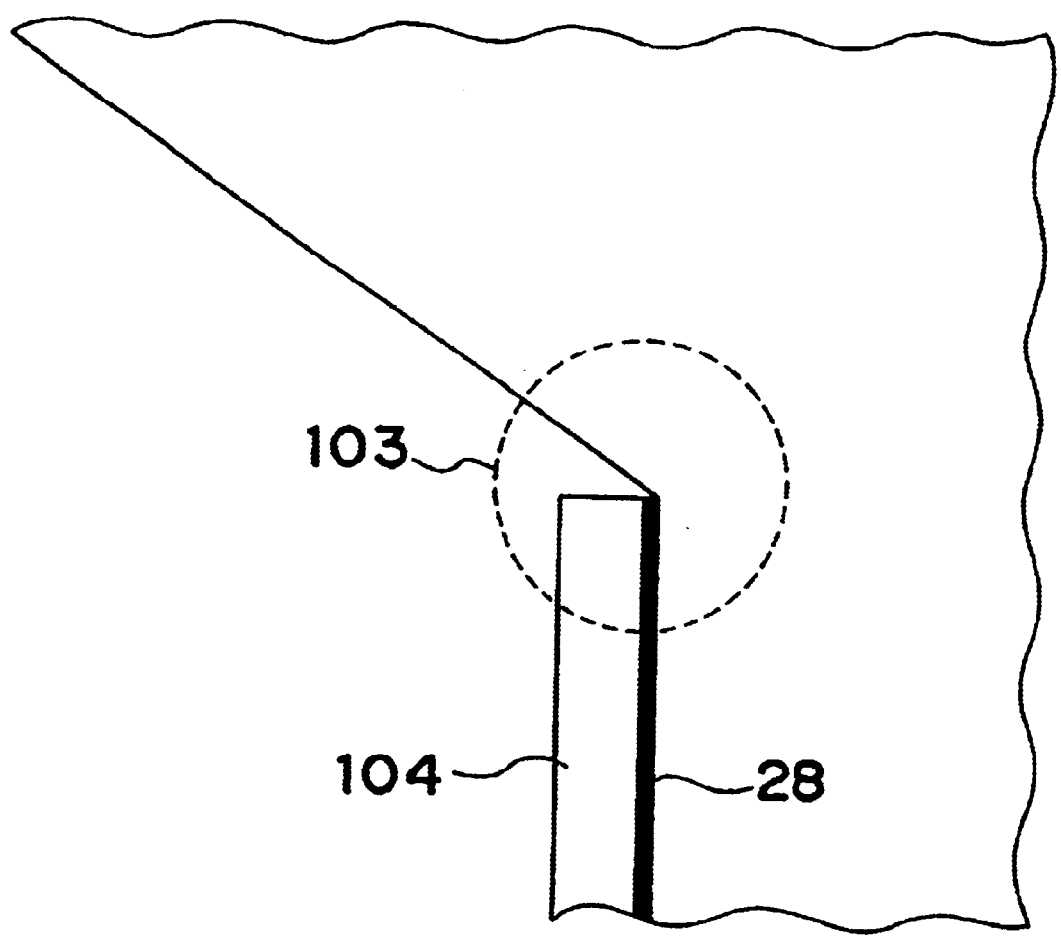
FIG. 22 is an enlarged view of an edge and its circumference for explaining the conventional over-sizing of the target edge.
Figure 23:
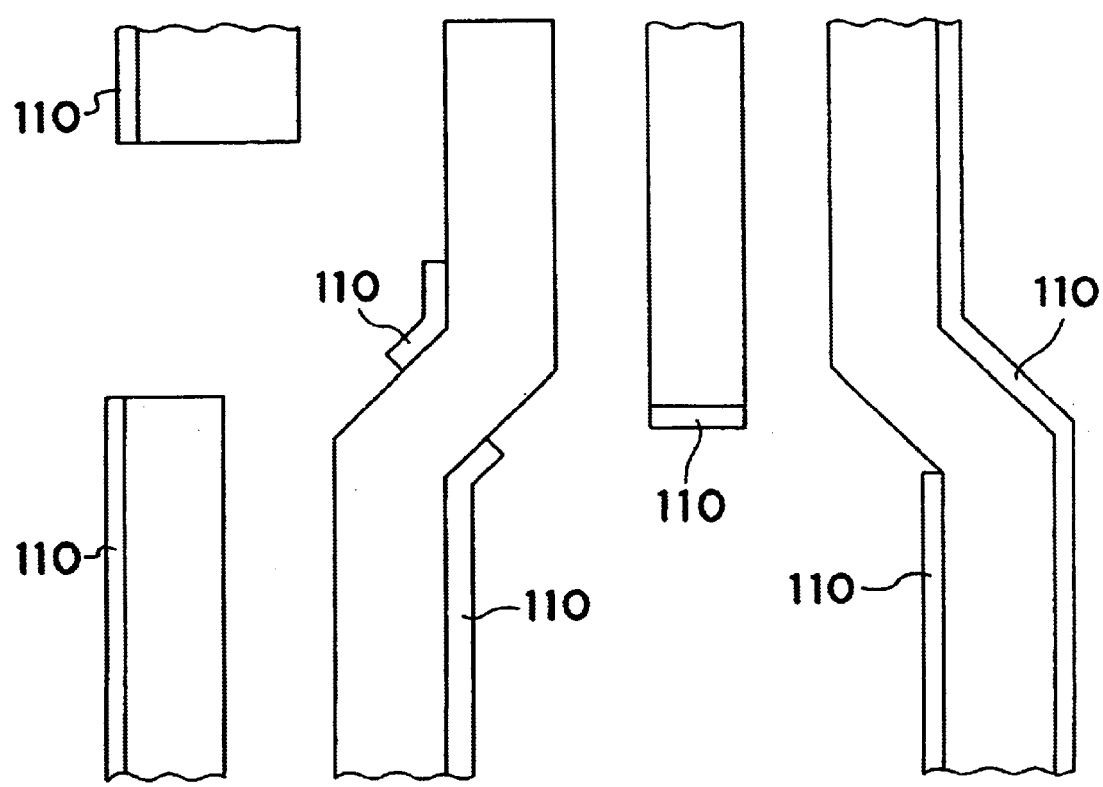
FIG. 23 shows a layout pattern which has been subjected to conventional over-sizing.
Figure 24:
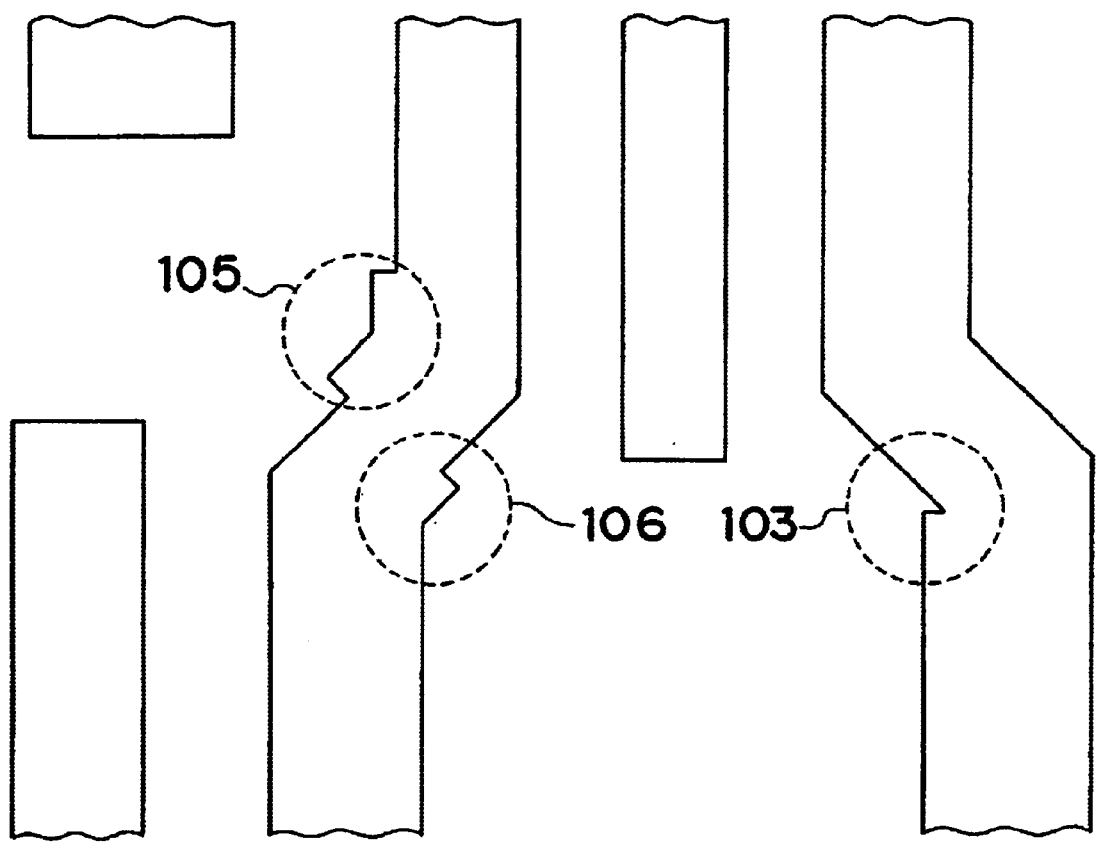
FIG. 24 shows a layout pattern which has been subjected to the conventional OPC.

Then, corrected patterns are produced (Step S14) as follows. If the layout patterns are subjected to sizing by DRC tool to produce corrected patterns in a manner similar to that described in connection with the related art, the resultant corrected patterns include a figure with a recess as shown in FIG. 22. Accordingly, in this embodiment, the layout patterns are subjected to sizing so that a protrusion or recess will not be produced. Sizing of the edge 28 (second target edge), for example, will be described with reference to FIGS. 10A, 10B, and 10C. FIGS. 10A, 10B, and 10C are enlarged views showing a part of the edge 28 and its circumference.

At first, an angle θ between the edge 28 which will be subjected to sizing and an edge 40 not to be corrected which continues to the edge 28 is measured shown in FIG. 10A.

Sizing for case where the angle θ is within 90° to 180° will be described with reference to FIGS. 10B and 10C. FIG. 10B shows an edge subjected to over-sizing for increasing a pattern width, and FIG. 10C shows an edge subjected to under-sizing for decreasing a pattern width.

The over-sizing for increasing a width of a pattern 20 will be described with reference to FIG. 10B. At first, the second target edge 28 is parallel translated toward an outside of the pattern 20 a predetermined distance corresponding to the amount of correction desired, so that a segment can be formed. Then, one end of the segment is extended to intersect with the edge 40 not to be corrected so that an edge 28Po is formed, and the coordinates of the point 41 of intersection of the edge 28Po with the edge 40 are determined. Finally, a pattern 42 surrounded with the edges 28, 28Po, and a segment between the vertexes 41 and 60 is produced as a corrected pattern.

The under-sizing for decreasing a width of the pattern 20 will be described with reference to FIG. 10C. At first, the second target edge 28 is parallel translated toward an inside of the pattern 20 with a predetermined distance corresponding to the amount of correction desired, so that a segment can be formed. Then, one end 60 of the edge 40 is extended to intersect with the segment, and the coordinates of the point 47 of intersection 47 are determined. Then, the segment is shortened to the intersection 47 so that an edge 28Pu is formed. Finally, a pattern 48 surrounded with the edges 28, 28Pu, and a segment between the vertexes 47 and 60 is produced as a corrected pattern.

Figure 11A:
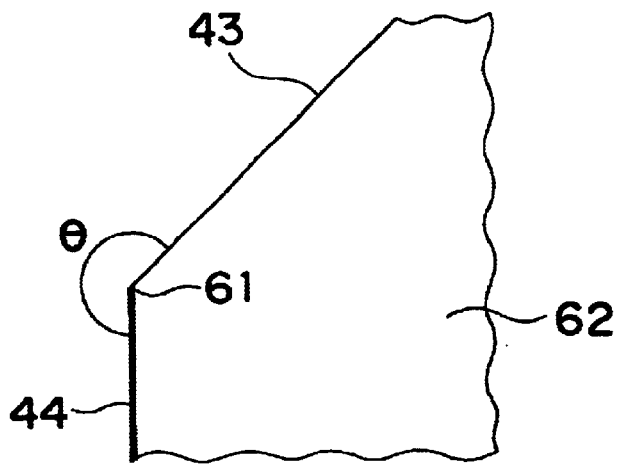
FIG. 11A through FIG. 11C are enlarged views of the target edges and their circumferences, respectively, for explaining a method of forming corrected patterns according to the first embodiment of the present invention.
Figure 11B:
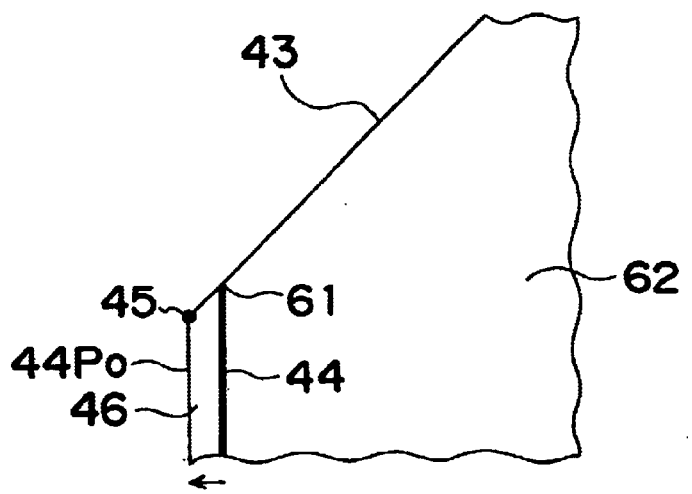
Figure 11C:
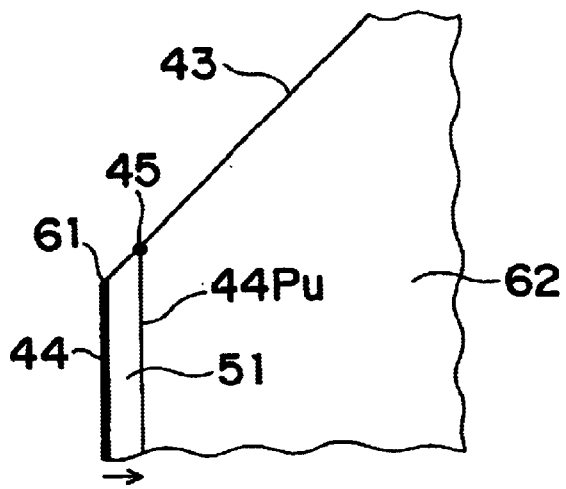

A sizing for the case where the angle θ is within 180° to 270° will be described with reference to FIGS. 11B and 11C. FIG. 11B shows an edge subjected to over-sizing, and FIG. 11C shows an edge subjected to under-sizing.

The over-sizing for increasing the width of a pattern 62 will be described with reference to FIG. 11B. At first, a target edge 44 is parallel translated toward an outside of the pattern 62 a predetermined distance corresponding to the amount of correction desired, so that a segment can be formed. Then, one end 61 of the edge 43 is extended to intersect with the segment and the coordinates of an intersection 45 are determined. Then, the segment is shortened to the point of intersection 45 so that an edge 44Po can be formed. Then, the coordinates of the point of intersection 45 are measured. Finally, a pattern 46 surrounded with the edges 44, 44Po, and a segment between the vertexes 45 and 61 is produced as a corrected pattern.

The under-sizing for reducing the width of the pattern 62 will be described with reference to FIG. 11C. At first, the target edge 44 is parallel translated toward an inside of the pattern 62 a predetermined distance corresponding to the amount of correction desired, so that a segment can be formed. Then, one end of the segment is extended to intersect the edge 43 not to be corrected so that an edge 44Pu is formed, and the coordinates of the intersection 45 of the edge 44Pu and the edge 43 are measured. Finally, a pattern 51 surrounded with the edges 44Pu, 46, and a segment between the vertexes 61 and 45 is produced as a corrected pattern.

Figure 12:
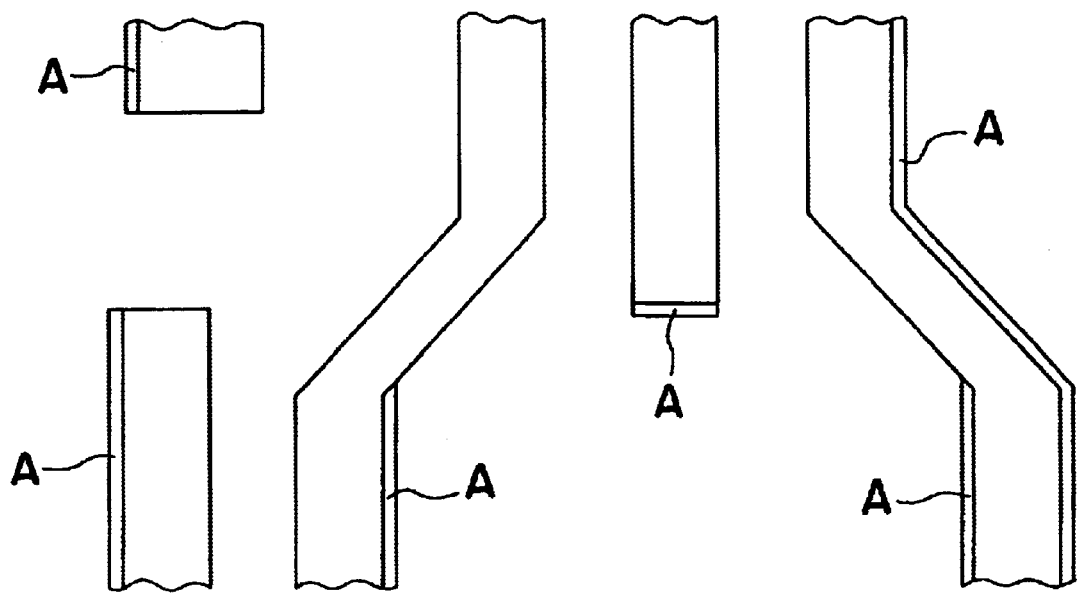
FIG. 12 shows a layout pattern in which the corrected patterns have been produced according to the first embodiment of the present invention.

As described above, the resultant corrected layout patterns are shown in FIG. 12. It is noted that A region in FIG. 12 shows the corrected pattern.

Figure 13:
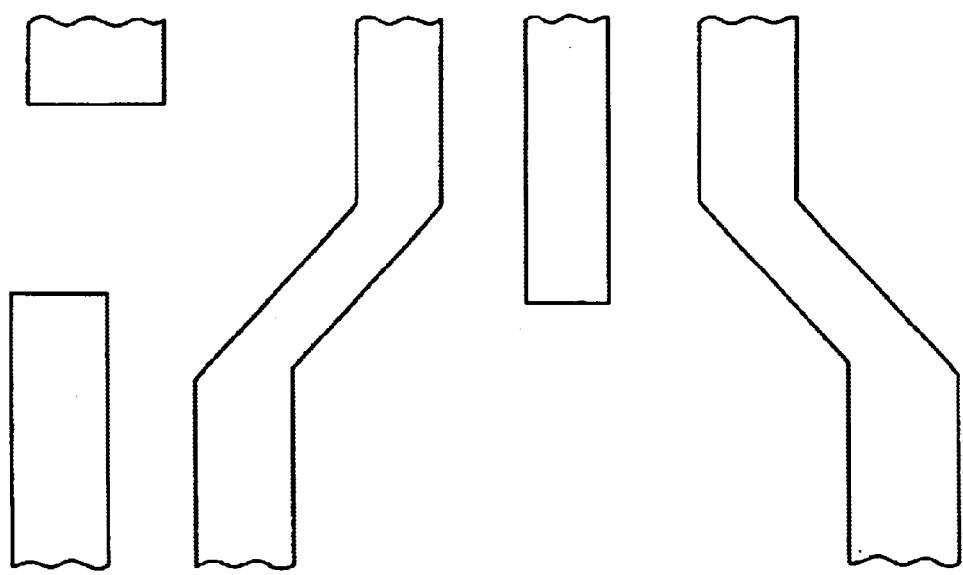
FIG. 13 shows a layout pattern which has been subjected to the OPC according to the first embodiment of the present invention.

Finally, OR (summing) operation is carried out between the corrected patterns and the original patterns (Step S15), so that layout patterns as shown in FIG. 13 can be obtained. As FIG. 13 indicates, the obtained layout patterns do not include any protrusions, recesses, and steps. Accordingly, the number of the vertexes in the patterns is decreased, resulting that the data amount can be reduced.

As described above, according to the first embodiment, an increment of data amount due to occurrence of the protrusions, recesses, and steps can be prevented.

(Embodiment 2)

In the second embodiment, a layout pattern data correction device is used which is substantially similar to that of the first embodiment shown in FIG. 3, and the sequence of correcting the layout pattern data by the layout pattern data correction device is also similar to that of the first embodiment shown in FIG. 4. Accordingly, the explanation about that is omitted.

In this second embodiment, there are a plurality of vertexes in an edge modifying region, since the layout pattern data, which has not been subjected to OPC, originally includes fine steps, or since the layout pattern data which was subjected to OPC once, is further subjected to OPC, although there is only one vertex in an edge modifying region in the first embodiment.

Hereinafter, a method of correcting the layout pattern data of the second embodiment will be described in detail with reference to FIG. 4, and FIG. 14 through FIG. 20.

Figure 14:
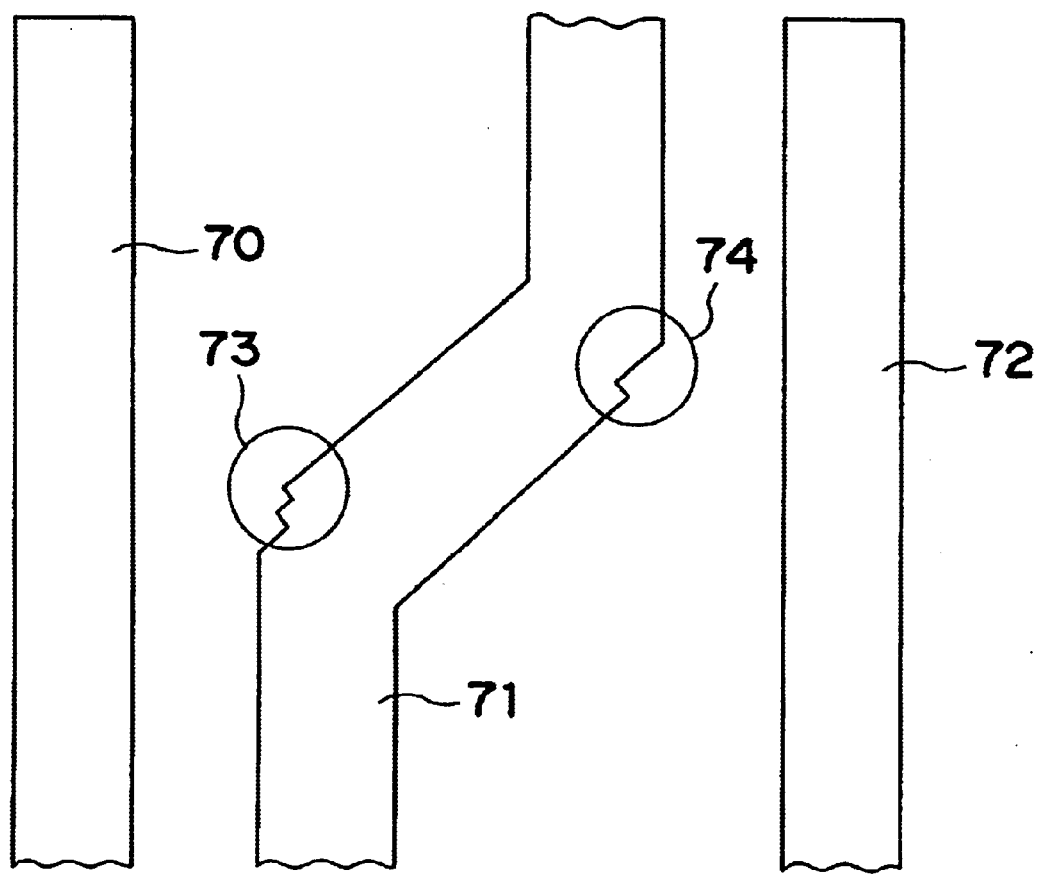
FIG. 14 shows an original layout pattern of the metal lines according to a second embodiment of the present invention.

FIG. 14 shows original layout pattern data of the second embodiment. As shown in FIG. 14, there are continuous steps 73 and a step 74. In this embodiment, it is assumed that an OPC in which the width of the layout patterns spaced a distance equal to or smaller than a constant value (K2) from the adjacent layout patterns are desired to be reduced.

At first, the edges of the pattern, which are spaced a distance greater than the constant value (K2) from the edges of their adjacent patterns, are extracted by using DRC tool. Then, edges which have not been extracted because they are at a distance of smaller or equal to K2 from adjacent patterns are extracted as the first target edges shown in FIG. 15 (Step S9). It is noted that the first target edges are shown as thicker segments in FIG. 15.

Figure 15:
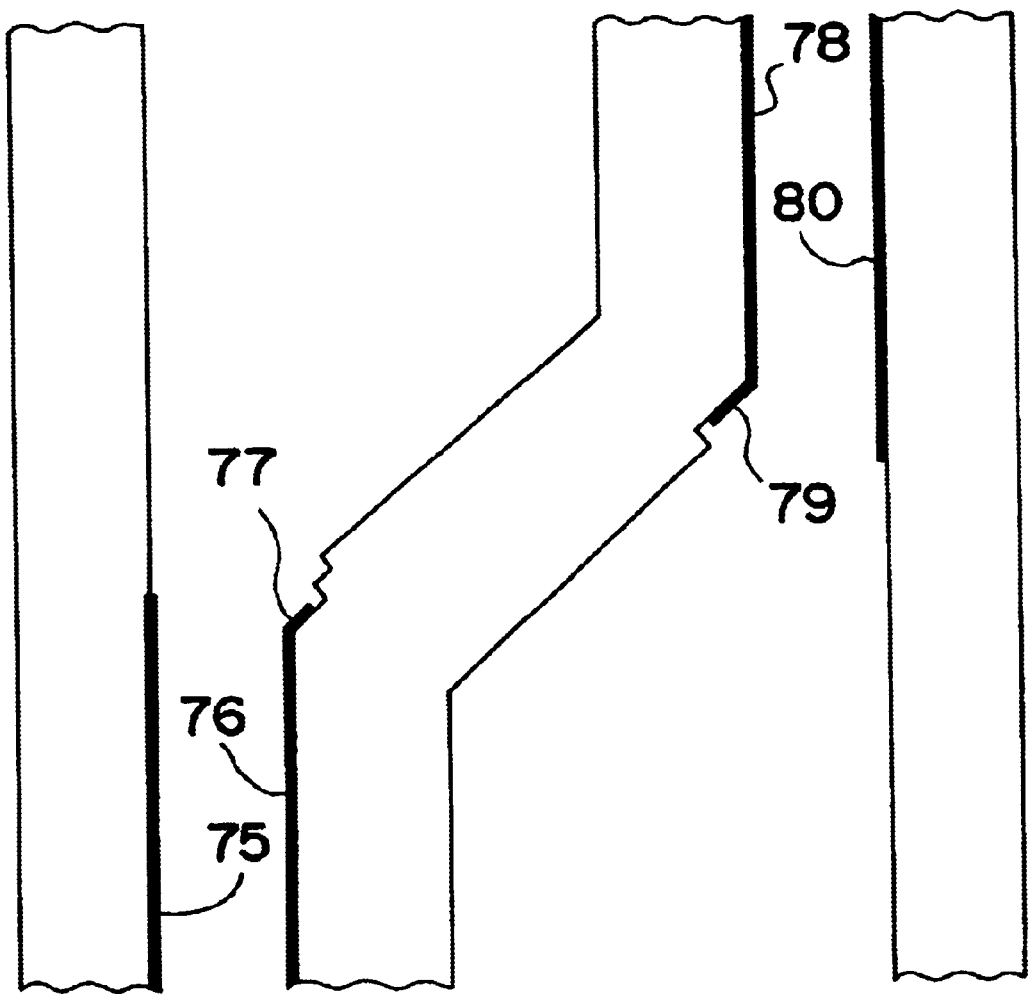
FIG. 15 shows a layout pattern in which the target edges have been extracted according to the second embodiment of the present invention.
Figure 16A:
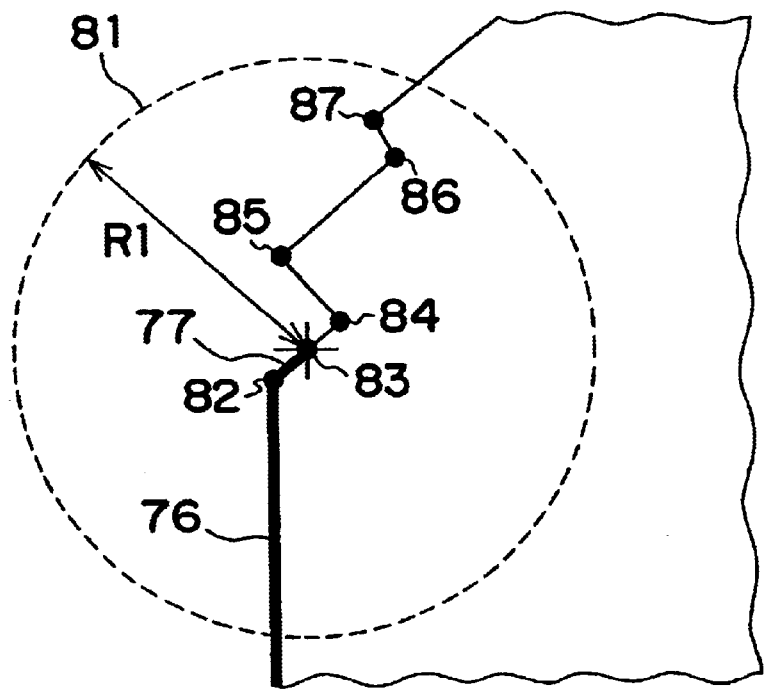
FIGS. 16A and 16B are enlarged views of the target edges and their circumferences, respectively, for explaining a method of modifying the edge to be corrected according to the second embodiment of the present invention.
Figure 16B:
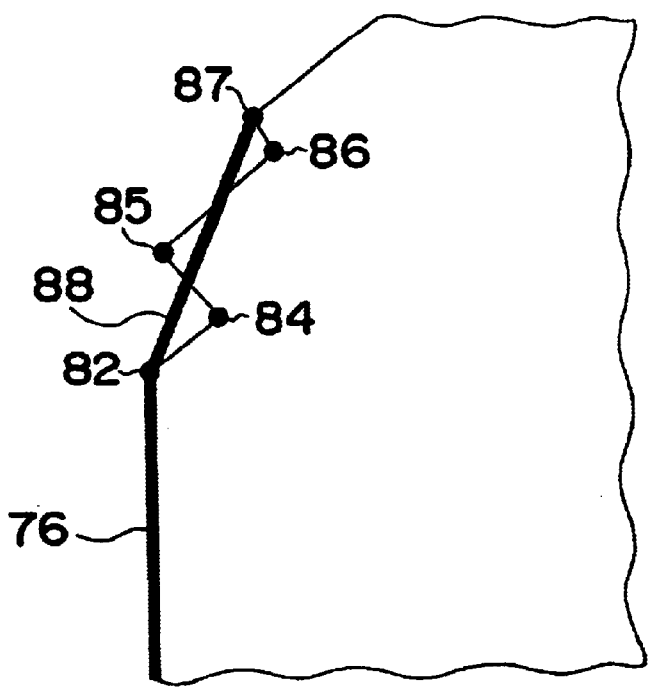

Then, an edge 77 in FIG. 15, for example, is chosen as an edge to be modified (Step S10). An enlarged view of the edge 77 and its circumference is shown in FIGS. 16A and 16B. As shown in FIG. 16A, the edge modifying region, that is, a region in which the target edges are modified, is set to a circle 81 having a radius R1 with an open end 83 taken as a center (Step S11).

Then, it is detected if there is a vertex in the edge modifying region or not. When the detection shows that there are a plurality of vertexes within the edge modifying region, the first target edge is modified as follows. At first, any two vertexes are connected to form segments within the edge modifying region. Then, a longest segment is chosen in the segments, and the longest segment becomes a modified edge to be corrected, that is, a second target edge (Step S12).

With reference to FIGS. 16A and 16B, the step S12 will be described in detail. There are five vertexes 82, 84, 85, 86, and 87 in the edge modifying region 81 as shown in FIG. 16A. In this case, a segment connecting between vertexes 82 and 87 is longest in the segments which are formed by connecting any two vertexes within the edge modifying region 81. Accordingly, the first target edge 77 is modified into a second target edge 88 to be corrected, as shown in FIG. 16B.

Next, it is determined whether or not all the target edges finish being subjected to the step S10 through the step S12 (Step S13). When there is an edge which has not been subjected yet, the program flow returns to the step S10, and on the contrary, when there is not any edge which has not been subjected yet, the program flow proceeds to a step S14.

Figure 17:
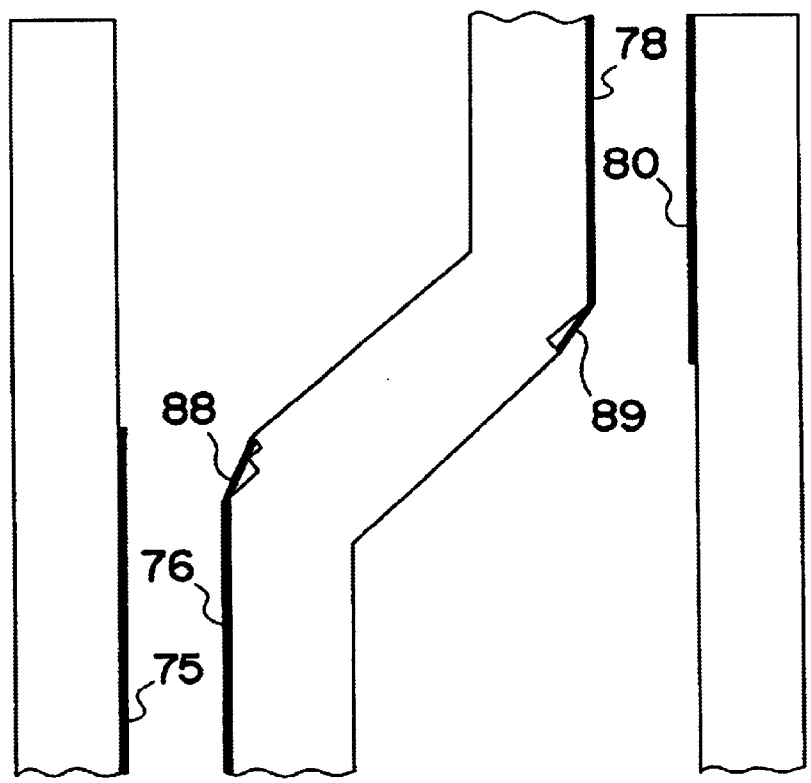
FIG. 17 shows a layout pattern in which the target edges have been modified according to the second embodiment of the present invention.

As described above, some first target edges which are required to be modified are modified, and the resultant layout patterns as shown in FIG. 17 are obtained. In FIG. 17, the second target edges are shown as a thicker segment.

Figure 18:
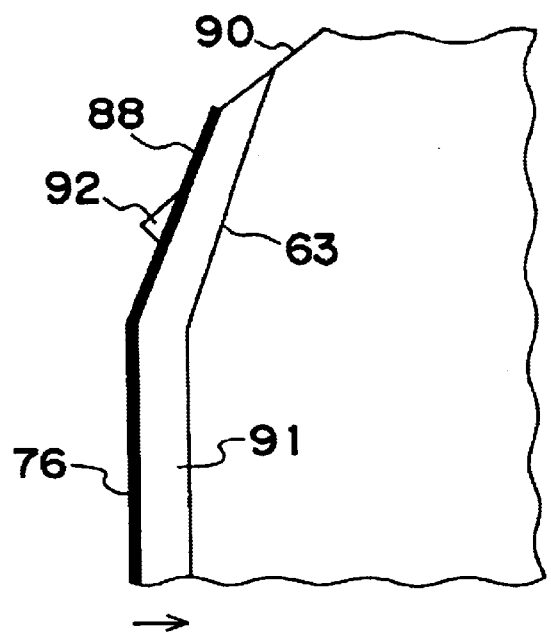
FIG. 18 is an enlarged view of the target edge and its circumference for explaining a method of forming corrected patterns according to the second embodiment of the present invention.

Then, corrected patterns are produced (Step S14). The following steps S14 and S15 for edges 88 and 76, for example, will be described with reference to FIG. 18 and FIG. 19. At first, the edges 88 and 76 are subjected to the under-sizing in a manner similar to that according to that described in connection with the first embodiment and the edges 88 and 76 are modified into an edge 63. The edge 63 is formed so that no protrusion is occurred between the edge 63 and the edge 91 not to be corrected. The obtained corrected pattern 91 is shown in FIG. 18. Next, if NOT (subtraction) operation is carried out between the corrected pattern 91 and the original pattern, since the OPC for reducing the pattern width is supposed in the second embodiment, a protuberant FIG. 92 remains as shown in FIG. 18.

Figure 19:
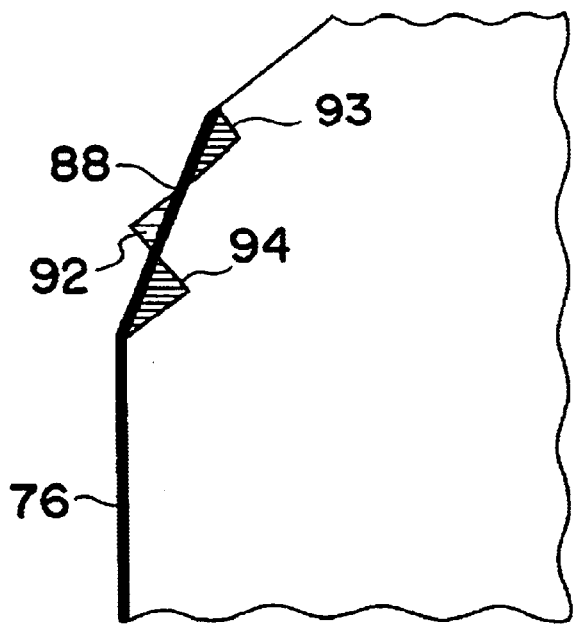
FIG. 19 is an enlarged view of the target edge and its circumference for explaining a method of forming corrected patterns according to the second embodiment of the present invention.

In order to prevent of the occurrence of the protuberant figure, the following procedure is carried out (Steps S14 and S15). At first, the figures 92, 93, and 94 are formed as shown in FIG. 19. Then, OR operation is carried out between the FIG. 93 and the original pattern, and between the FIG. 94 and the original pattern. In addition, NOT operation is carried out between the FIG. 92 and the resultant figure which is formed by the above-mentioned OR operations.

Figure 20:
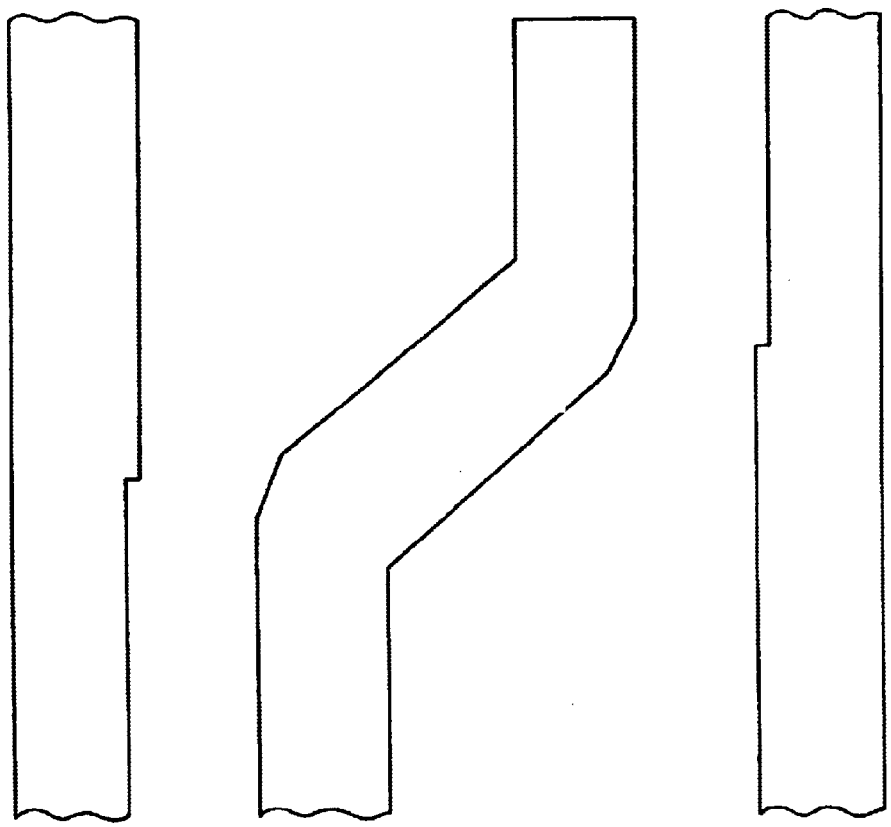
FIG. 20 shows a layout pattern which has been subjected to the OPC according to the second embodiment of the present invention.
Figure 21:
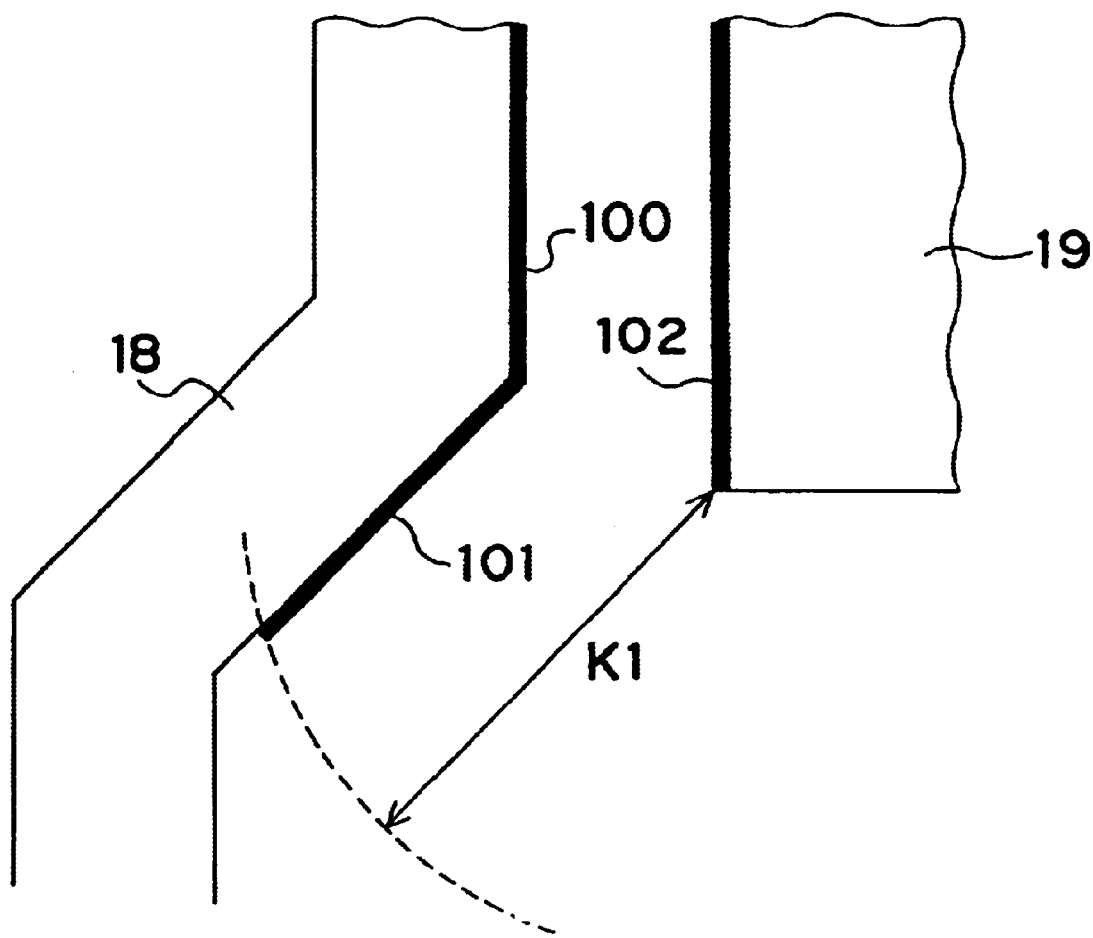
FIG. 21 is an enlarged view of edges and their circumferences for explaining the method of extracting the target edges.

As a result of these boolean operations, the layout patterns as shown in FIG. 20 are obtained. FIG. 20 indicates that the steps 73 and 74 (FIG. 14) are deleted, as well as the occurrence of the unnecessary protrusions, recesses, and steps is prevented. Accordingly, the number of the vertexes of the patterns is decreased, resulting that the data amount can be reduced.

As described above, according to the second embodiment, an increment of data amount due to an occurrence of the protrusions, recesses, and steps can be prevented.

In accordance with the present invention, since the first target edge is extracted, the edge modifying region in which the first target edge is modified is set, the first target edge is modified into the second target edge, the corrected pattern is formed based on the second target edge, and boolean operation is performed based on the original layout pattern and the corrected pattern.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A layout pattern data correction device comprising:
   (a) edge extracting means for extracting a first target edge to be corrected from an original layout pattern of a circuit;
   (b) edge modifying region setting means for setting an edge modifying region in which the first target edge is modified with a predetermined point in the first target edge taken as a center;
   (c) edge modifying means for modifying the first target edge within the edge modifying region into a second target edge to be corrected;
   (d) corrected pattern forming means for forming a corrected pattern based on the second target edge; and
   (e) boolean operation means for performing a predetermined boolean operation based on both of the original layout pattern and the corrected pattern.

2. A layout pattern data correction device according to claim 1, wherein the edge modifying means comprises means for lengthening or shortening the first target edge so that one end of the first target edge aligns with a vertex within the edge modifying region.

3. A layout pattern data correction device according to claim 1,
   wherein the edge modifying region includes a plurality of vertexes; and
   wherein the edge modifying means comprises means for choosing a longest segment in segments which are formed by connecting any two vertexes of the plurality of vertexes within the edge modifying region, and modifying the first target edge into the longest segment as the second target edge.

4. A layout pattern data correction device according to claim 1, wherein the corrected pattern forming means comprises means for measuring an angle between the second target edge and an edge not to be corrected which continues to the second target edge, and forming the corrected pattern in accordance with the angle.

5. A layout pattern data correction device according to claim 1, wherein the corrected pattern forming means comprises means for forming the corrected pattern which is surrounded with the modified second target edge and the original layout pattern, when the second target edge does not fit to an edge of an edge of the original layout pattern.

6. A method of correcting layout pattern data comprising the steps of:

(a) extracting a first target edge to be corrected from an original layout pattern of a circuit;

(b) setting an edge modifying region in which the first target edge is modified with a predetermined point in the first target edge taken as a center;

(c) modifying the first target edge within the edge modifying region into a second target edge to be corrected;

(d) forming a corrected pattern based on the second target edge; and (e) performing a predetermined boolean operation based on both of the original layout pattern and the corrected pattern.

7. A method of correcting layout pattern data according to claim 6, wherein the step of modifying the first target edge (c) comprises the step of lengthening or shortening the first target edge so that one end of the first target edge aligns with a vertex within the edge modifying region.

8. A method of correcting layout pattern data according to claim 6, wherein the edge modifying region includes a plurality of vertexes; and wherein the step of modifying the first target edge (c) comprises the step of choosing a longest segment in segments which are formed by connecting any two vertexes of the plurality of vertexes within the edge modifying region, and modifying the first target edge into the longest segment as the second target edge.

9. A method of correcting layout pattern data according to claim 6, wherein the step of forming the corrected pattern (d) comprises the step of measuring an angle between the second target edge and an edge not to be corrected which continues to the second target edge, and forming the corrected pattern in accordance with the angle.

10. A method of correcting layout pattern data according to claim 6, wherein the step of forming the corrected pattern (d) comprises the step of modifying the second target edge and forming the corrected pattern which is surrounded with the modified second target edge and the original layout pattern, when the second target edge does not fit to an edge of an edge of the original layout pattern.

11. A method of producing a semiconductor device according to the method as defined in claim 6.

12. A computer readable medium in which a layout pattern data correction program is recorded, the program comprising the steps of:

(a) extracting a first target edge to be corrected from an original layout pattern of a circuit;

(b) setting an edge modifying region in which the first target edge is modified with a predetermined point in the first target edge taken as a center;

(c) modifying the first target edge within the edge modifying region into a second target edge to be corrected;

(d) forming a corrected pattern based on the second target edge; and (e) performing a predetermined boolean operation based on both of the original layout pattern and the corrected pattern.

13. A computer readable medium according to claim 12, wherein the step of modifying the first target edge (c) comprises the step of lengthening or shortening the first target edge so that one end of the first target edge aligns with a vertex within the edge modifying region.

14. A computer readable medium according to claim 12, wherein the edge modifying region includes a plurality of vertexes; and wherein the step of modifying the first target edge (c) comprises the step of choosing a longest segment in segments which are formed by connecting any two vertexes of the plurality of vertexes within the edge modifying region, and modifying the first target edge into the longest segment as the second target edge.

15. A computer readable medium according to claim 12, wherein the step of forming the corrected pattern (d) comprises the step of measuring an angle between the second target edge and an edge not to be corrected which continues to the second target edge, and forming the corrected pattern in accordance with the angle.

16. A computer readable medium according to claim 12, wherein the step of forming the corrected pattern (d) comprises the step of modifying the second target edge and forming the corrected pattern which is surrounded with the modified second target edge and the original layout pattern, when the second target edge does not fit to an edge of the original layout pattern.

* * * * *